(12) United States Patent
Do

(10) Patent No.: US 11,315,974 B2
(45) Date of Patent: Apr. 26, 2022

(54) IMAGE SENSING DEVICE AND METHOD FOR FORMING THE SAME

(71) Applicant: SK hynix Inc., Icheon-si (KR)

(72) Inventor: Young Woong Do, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/590,984

(22) Filed: Oct. 2, 2019

(65) Prior Publication Data
US 2020/0395392 A1 Dec. 17, 2020

(30) Foreign Application Priority Data
Jun. 11, 2019 (KR) ........................ 10-2019-0068503

(51) Int. Cl.
*H01L 27/146* (2006.01)

(52) U.S. Cl.
CPC .... *H01L 27/1463* (2013.01); *H01L 27/14607* (2013.01); *H01L 27/14621* (2013.01); *H01L 27/14643* (2013.01); *H01L 27/14685* (2013.01)

(58) Field of Classification Search
CPC ........... H01L 27/14643; H01L 27/1463; H01L 27/14621; H01L 27/14607; H01L 27/14685; H01L 27/14645; H01L 27/14627; H01L 27/14623
See application file for complete search history.

(56) References Cited

U.S. PATENT DOCUMENTS

| | | | |
|---|---|---|---|
| 8,507,964 B2 | 8/2013 | Nozaki et al. | |
| 9,620,538 B2* | 4/2017 | Lee | H01L 27/14634 |
| 2010/0108973 A1* | 5/2010 | Lee | H01L 27/14621 |
| | | | 257/2 |
| 2012/0313206 A1* | 12/2012 | Nozaki | H01L 27/14605 |
| | | | 257/432 |
| 2013/0270578 A1* | 10/2013 | Kramer | H01L 23/3738 |
| | | | 257/77 |
| 2014/0299750 A1* | 10/2014 | Iwasaki | G01N 21/6454 |
| | | | 250/226 |
| 2016/0049430 A1* | 2/2016 | Nomura | H01L 27/1463 |
| | | | 257/432 |
| 2016/0172398 A1* | 6/2016 | Kim | H01L 27/14645 |
| | | | 257/432 |
| 2016/0336304 A1* | 11/2016 | Wu | H01L 21/6835 |
| 2017/0003165 A1* | 1/2017 | Skorka | H01L 27/14636 |
| 2017/0180695 A1* | 6/2017 | Tanaka | H04N 5/2256 |
| 2018/0182808 A1* | 6/2018 | Kim | H01L 27/14687 |
| 2018/0295295 A1* | 10/2018 | Hicks | H01L 27/14649 |
| 2019/0096929 A1* | 3/2019 | Chiang | H01L 27/14612 |
| 2019/0131327 A1* | 5/2019 | Chou | H01L 27/1463 |
| 2019/0131333 A1* | 5/2019 | Borthakur | H01L 27/14623 |
| 2019/0157329 A1* | 5/2019 | Kim | H01L 27/14612 |
| 2020/0395392 A1* | 12/2020 | Do | H01L 27/14627 |

* cited by examiner

*Primary Examiner* — Vongsavanh Sengdara
(74) *Attorney, Agent, or Firm* — Perkins Coie LLP

(57) ABSTRACT

An image sensing device and a method for forming the same are disclosed. The image sensing device includes a substrate including photoelectric conversion elements, and a grid structure disposed over the substrate. The grid structure includes an inner grid layer, and an outer grid layer formed outside the inner grid layer to provide air layer formed at a side surface and a top surface of the inner grid layer.

19 Claims, 12 Drawing Sheets

IMAGE SENSING DEVICE AND METHOD FOR FORMING THE SAME

CROSS-REFERENCE TO RELATED APPLICATION

This patent document claims the priority and benefits of Korean patent application No. 10-2019-0068503 filed on Jun. 11, 2019, which is incorporated in its entirety by reference herein.

TECHNICAL FIELD

Embodiments of the disclosed technology generally relate to an image sensing device.

BACKGROUND

An image sensing device is a semiconductor device for converting an optical image into electrical signals. With the recent development of computer industries and communication industries, demand for high-quality and high-performance image sensor is driven by various electronics applications such as digital cameras, camcorders, personal communication systems (PCSs), game consoles, surveillance cameras, medical micro-cameras, robots, etc.

SUMMARY

This patent document provides, among others, designs of an image sensing device that can effectively provide a light guarding effect of incident light and prevent optical crosstalk between the color filters.

Some embodiments of the disclosed technology relate to an image sensing device that includes a grid structure for maximizing a light guarding effect of incident light and preventing crosstalk between the color filters. Some embodiments of the disclosed technology relate to an image sensing device that includes a grid structure in which a void space surrounds each metal layer located at boundary regions between adjacent color filters, thereby minimizing a crosstalk between adjacent pixels.

In an embodiment of the disclosed technology, an image sensing device may include a substrate including photoelectric conversion elements, and a grid structure disposed over the substrate. The grid structure may include an inner grid layer, and an outer grid layer formed outside the inner grid layer to provide an air layer formed at a side surface and a top surface of the inner grid layer.

In another embodiment of the disclosed technology, a method for forming an image sensing device may include forming an inner grid layer over a substrate including photoelectric conversion elements, forming a sacrificial film along outer surface of the inner grid layer, forming a support material layer over the sacrificial film, patterning the sacrificial film and the support material layer to form a stacked structure of a sacrificial film pattern and a support film in a predefined grid structure region, forming a first capping film to cover the stacked structure of the sacrificial film pattern and the support film, removing the sacrificial film pattern to form an air layer at a position from which the sacrificial film pattern is removed, and forming a second capping film over the first capping film.

In another embodiment of the disclosed technology, an image sensing device includes a substrate, an array of photoelectric conversion elements supported by the substrate, each photoelectric conversion element structured to convert light into an electrical signal, and a grid structure disposed over the substrate to separate photoelectric conversion elements. The grid structure includes an inner grid layer, and an outer grid layer formed outside the inner grid layer to a space between the inner grid layer and the outer grid layer to provide an air layer formed between the inner grid layer and the outer grid layer at a side surface and a top surface of the inner grid to facilitate separating adjacent photoelectric conversion elements.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
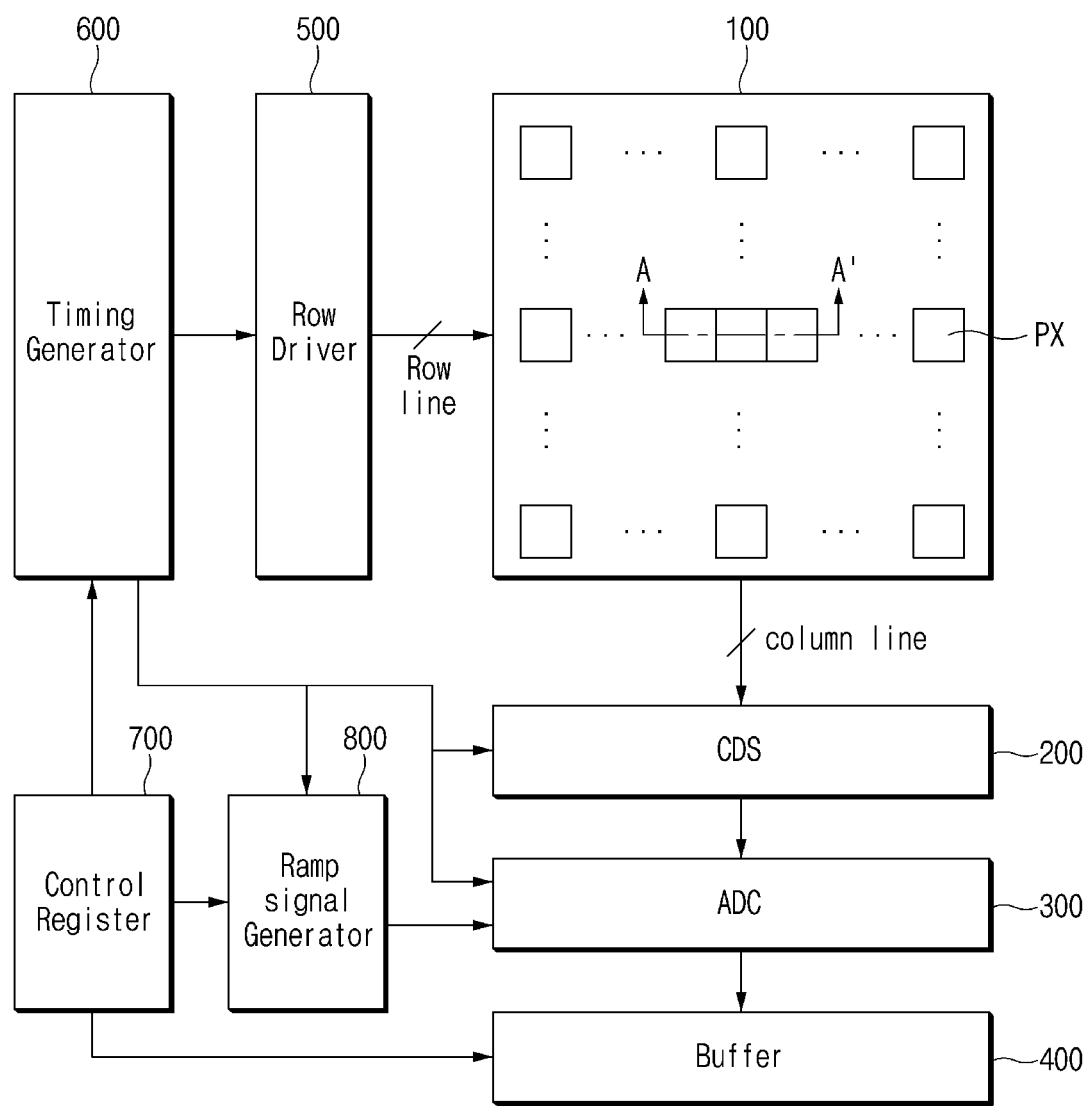
FIG. 1 is a block diagram illustrating an image sensing device based on an embodiment of the disclosed technology.

FIG. 1 is a block diagram illustrating an image sensing device based on an embodiment of the disclosed technology.

The image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a matrix shape. Each of the unit pixels (PXs) may convert optical image information (e.g., light incident onto the unit pixels) into an electrical image signal to represent the optical image information. In some embodiments of the disclosed technology, the unit pixels (PXs) may output the electrical image signal to the correlated double sampler (CDS) 200 through column lines. Each of the unit pixels (PXs) may be coupled to any one of row lines and any one of column lines.

Image sensing devices may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample the electrical image signal received from the unit pixels (PXs) of the pixel array 100. For example, the correlated double sampler (CDS) 200 may perform double sampling based on a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200 to output a comparison signal indicating the result of comparison between the ramp signal and the sampling signal. In some implementations, the ADC 300 may use a reference signal (e.g., ramp signal) to sample an input signal (e.g., pixel signal) multiple times using the reference signal and analog-to-digital convert the sampled input signals by counting the number of clocks until crossing points. The ADC 300 may count a level transition time of the comparison signal in response to a clock signal received from the timing generator 600, and may output a count value indicating the counted level transition time to the buffer 400. For example, the ADC 300 may count clock pulses during a period of time when the input signal is above the reference signal and stop counting clock pulses upon detection of a crossing point (crossing of the reference signal and the input signal).

The buffer 400 may store each of the digital signals received from the ADC 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may be used to select and drive selected pixels of the pixel array 100 on a row line basis in response to an output signal of the timing generator 600. For example, the row driver 500 may generate a selection signal to select any one of the row lines. The selection signal may include a control signal to control on/off operations of pixel transistors (not shown).

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
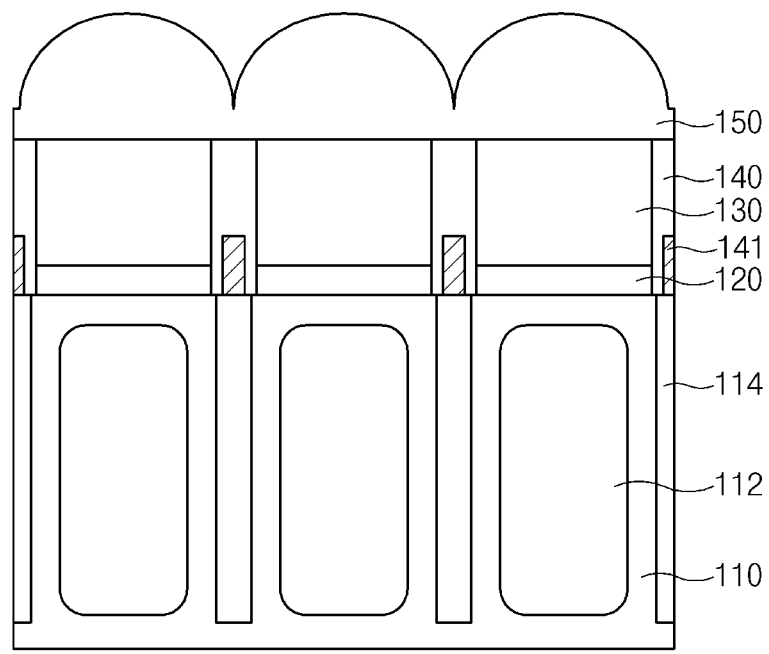
FIG. 2 is a cross-sectional view illustrating a pixel array taken along the line A-A' shown in FIG. 1 based on an embodiment of the disclosed technology.

FIG. 2 is a cross-sectional view illustrating the pixel array 100 taken along the line A-A' shown in FIG. 1.

As illustrated in FIG. 2, the pixel array 100 of the image sensing device may include a substrate 110, a buffer layer 120, a color filter layer 130, a grid structure 140, and a lens layer 150.

The substrate 110 may include a semiconductor substrate made of a suitable semiconductor material. The substrate 110 may be in a monocrystalline state, and may include a silicon-containing material. For example, the substrate 110 may include a monocrystalline silicon or a monocrystalline silicon-containing material. That is, the semiconductor substrate may include a monocrystalline silicon-containing material. In some implementations, the substrate 110 may include P-type impurities. Several fabrication processes are performed on the substrate 110 and one or more photoelectric conversion elements 112 are formed on or in the substrate 110. The substrate 110 may include a device isolation structure 114 by which the photoelectric conversion elements 112 are separated from each other. The device isolation structure 114 may be formed as a Deep Trench Isolation (DTI) structure in which at least one of an insulation film and the air is buried.

Each of the photoelectric conversion elements 112 may be implemented to include an organic or inorganic photodiode in some applications and may use other form of photosensing circuitry in other applications. The photoelectric conversion element 112 may include impurity regions vertically stacked on or in the substrate 110. For example, each of the photoelectric conversion elements 112 may include a photodiode in which an N-type impurity region and a P-type impurity region are vertically stacked. The N-type impurity region and the P-type impurity region may be formed by ion implantation.

The buffer layer 120 is substantially transparent to light to be detected and may be structured to operate as a planarization layer to flatten uneven surfaces of predefined structures formed on or in the substrate 110, and may also operate as an anti-reflection film to allow incident light received through the color filter layers 130 to pass through the photoelectric conversion elements 112 of the substrate 110 while minimizing reflections. The buffer layer 120 may be formed over the substrate 110. For example, the buffer layer 120 may be formed below the color filter layer 130 or may be formed below the grid structure 140 and the color filter layer 130. The buffer layer 120 may be formed of a multi-layer structure formed by stacking different materials having different refractive indexes. For example, the buffer layer 120 may include a multilayer structure formed by stacking at least one nitride film and at least one oxide film. The nitride film may include a silicon nitride film (e.g., $Si_xN_y$, where each of 'x' and 'y' is a natural number) or a silicon oxide nitride film (e.g., $Si_xO_yN_z$, where each of 'x', 'y', and 'z' is a natural number). The oxide film may include a monolayer structure formed of any one of an undoped silicate glass (USG) film and an ultra low temperature oxide (ULTO) film, or may include a multilayer structure formed by stacking the USG film and the ULTO film. A detailed structure of the buffer layer 120 will hereinafter be described in detail.

The color filter layer 130 may include optical filters located above the photoelectric conversion elements 112 to filter the light to be detected by the photoelectric conversion elements 112. For some applications, the color filter layer 130 may be structured to transmit visible light such as light of a predetermined wavelength range within the visible spectral range while blocking light at other wavelengths from incident light received through the lens layer 150. The color filter layer 130 may include a plurality of color filters, and the color filters may be formed to fill the gaps between the grid structures 140. In the illustrated example in FIG. 2, a color filter is formed for each unit pixel (PX). The color filter layer 130 may include a plurality of red color filters (Rs), a plurality of green color filters (Gs), and a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red filters (Rs), the green filters (Gs), and the blue filters (Bs) may be arranged in a Bayer pattern. Alternatively, the color filter layer 130 may include a plurality of cyan filters, a plurality of yellow filters, and a plurality of magenta filters.

The grid structures 140 can be optically opaque or optically absorptive to spatially and optically isolate or separate the space into light sensing regions in which the photoelectric conversion elements 112 are located. Each grid structure 140 may be located at a boundary region of two adjacent color filters to prevent optical crosstalk from occurring between the adjacent color filters. The grid structures 140 may be formed such that it is in contact with sidewalls of the color filters 130. In an embodiment of the disclosed technology, the grid structure 140 may include an air layer that surrounds sides of a metal layer 141. In some implementations of the disclosed technology, the grid structure 140 may be formed as an air capping structure in which the air surrounds the sides and a top of the metal layer 141. For example, the grid structure 140 may be formed to include air layers formed at one or more side surfaces of the metal layer, respectively, and air layers (or void space) formed at a top surface of the metal layer 141. For example, light incident to one color filter in the color filter layer 130 at an angle may be incident on the side wall of the color filter that interfaces with the grid structure 140. Because the color filter layer 130 has a refractive index greater than the refractive index of the grid structure 140 (e.g., air with an index of 1), the total internal reflection at the interface between the color filter layer 130 and the grid structure 140 can prevent the light rays incident to the color filter from entering the adjacent color filter due to the total internal reflection, thus providing an optical isolation between the adjacent color filters. Notably, using the air as the low-index material in the grid structure 140 can produce the largest angular range of incident light to be totally reflected and can enhance the optical isolation effect of the grid structure 140.

When a light ray having passed through the color filters reaches the air grid having a refractive index of 1, if an incident angle of the light ray is smaller than a threshold angle, the air grid may not serve as a light blocking grid and the light ray having reached the air grid can pass through the air grid to reach to an adjacent color filter. Accordingly, the metal layer implemented based on some embodiments of the disclosed technology may be formed in the air grid to absorb the light ray having passed through the air grid, so that crosstalk of light ray can be prevented from occurring. Examples of specific implementations of the structure of the grid structure 140 will hereinafter be described in detail.

The lens layer 150 may include a plurality of micro-lenses (and/or a plurality of on-chip lenses) disposed over the color filter layers 130 and the grid structures 140. The plurality of micro-lenses may converge incident light received from the outside and may transmit the light to the color filter layers 130.

Figure 3:
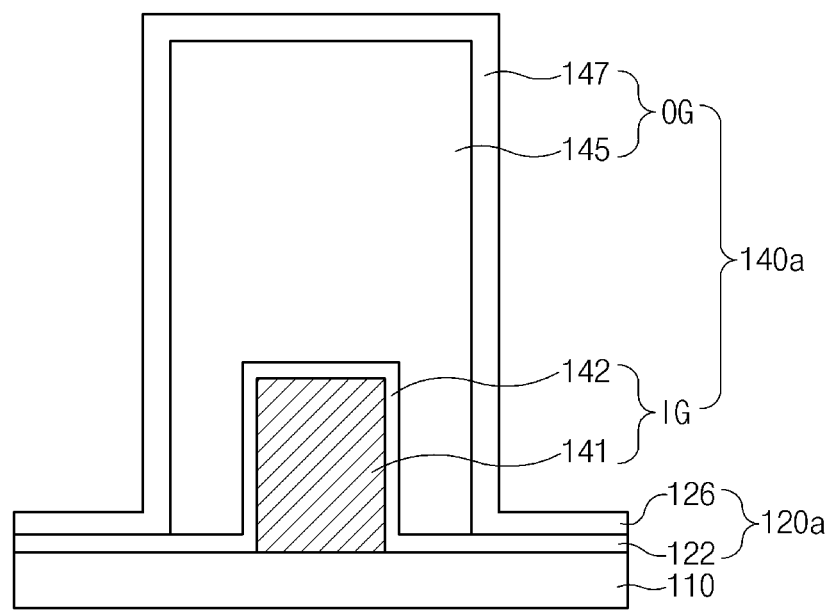
FIG. 3 is a cross-sectional view illustrating a buffer layer and a grid structure shown in FIG. 2 based on an embodiment of the disclosed technology.

FIG. 3 is a cross-sectional view illustrating the buffer layer and the grid structure shown in FIG. 2 based on an embodiment of the disclosed technology.

As illustrated therein, a buffer layer 120a may be formed over the substrate 110, and may include a stacked structure of an insulation film 122 and a capping film 126.

In this case, the insulation film 122 may include a monolayer structure formed of a nitride film or an oxide film, or may include stacked layers of a nitride film and an oxide film. The insulation film 122 may include a silicon nitride film (e.g., $Si_xN_y$, where each of 'x' and 'y' is a natural number) or a silicon oxide nitride film (e.g., $Si_xO_yN_z$, where each of 'x', 'y', and 'z' is a natural number). The insulation film 122 may include at least one of an undoped silicate glass (USG) film and a silicon oxide film ($SiO_2$).

The capping film 126 may be formed of the same material film as a capping film 147 of an outer grid OG. The capping film 126 may include a multilayer structure including an oxide film. For example, the capping film 126 may be formed of a double oxide film (two oxide films) or may be formed of a multilayer structure formed by stacking an oxide film and other material films different from the oxide film. The oxide film of the capping film 126 may include an ultra low temperature oxide (ULTO) film such as a silicon oxide film ($SiO_2$).

The grid structure 140a may include an inner grid IG and an outer grid OG. In the context of this patent document, the term "inner grid" and "outer grid" that are used in conjunction with the grid structure is used to indicate one or more material layers that constitute the grid structure.

The inner grid IG may include a metal layer 141 formed over the substrate 110 and an insulation film 142 formed to cover all or part of the metal layer 141.

The metal layer 141 may include tungsten (W). The insulation film 142 may be formed of the same material film as the insulation film 122 of the buffer layer 120a. In an embodiment of the disclosed technology, the insulation film 122 and the insulation film 142 are distinguished from each other depending on where those films are formed. In another embodiment of the disclosed technology, the insulation films 122 and 142 may also be simultaneously formed by the same deposition process.

The outer grid OG may include an air layer 145 and a capping film 147 capping the air layer 145.

The air layer 145 may be formed at side surfaces and a top surface of the inner grid IG, thereby capping the entirety of the inner grid IG. In the context of this patent document, the term "capping" that is used in conjunction with the air layer 145 is used to indicate an air layer that surrounds the sides and a top of the metal layer, and the term "cap" or "capping" that is used in conjunction the capping film 147 is used to indicate covering the air layer 145 with the capping film 147. The capping film 147 may be a material film formed at an outermost part of the grid structure 140a, and may perform "capping" of the air layer 145, thereby defining a specific region in which the air layer 145 is formed. The capping film 147 may be formed of the same material film as the capping film 126 of the buffer layer 120a. In an embodiment of the disclosed technology, the capping film 126 and the other capping film 147 are distinguished from each other depending on where those films are formed. In another embodiment of the disclosed technology, the capping film 126 and the other capping film 147 may also be simultaneously formed by the same deposition process.

Figure 4:
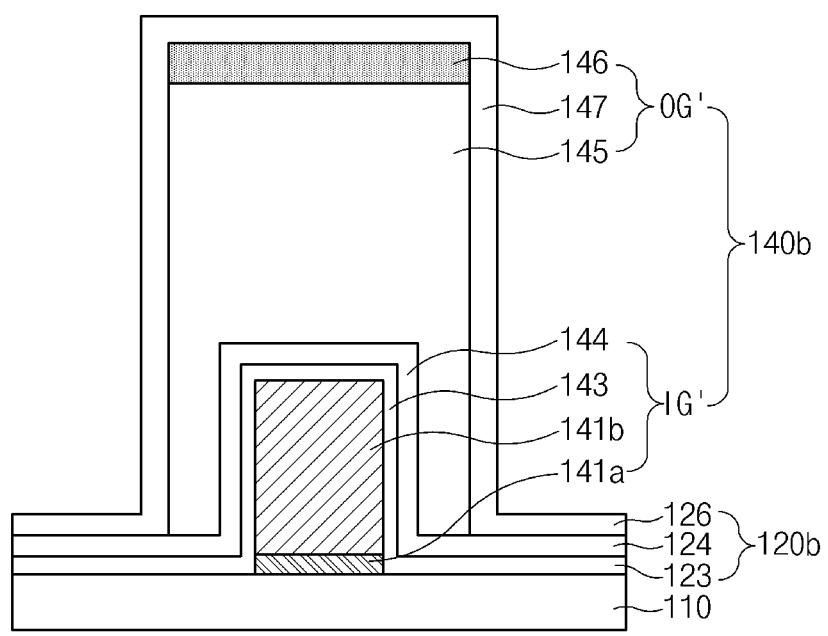
FIG. 4 is a cross-sectional view illustrating a buffer layer and a grid structure shown in FIG. 2 based on another embodiment of the disclosed technology.

FIG. 4 is a cross-sectional view illustrating the buffer layer and the grid structure shown in FIG. 2 based on another embodiment of the disclosed technology. In FIG. 4, the same reference numerals as those of FIG. 3 will be used to refer to the same or like parts for convenience of description and better understanding of the disclosed technology.

As shown in FIG. 4, the buffer layer 120b may be formed over the substrate 110, and may include a stacked structure of a nitride film 123, an oxide film 124, and a capping film 126.

In this case, the nitride film 123 may include a silicon nitride film (e.g., $Si_xN_y$, where each of 'x' and 'y' is a natural number) or a silicon oxide nitride film (e.g., $Si_xO_yN_z$, where each of 'x', 'y', and 'z' is a natural number). The oxide film 124 may include an undoped silicate glass (USG) film. The capping film 126 may be formed of the same material film as the capping film 147 of the outer grid OG. The capping film 126 may include a multilayer structure including an oxide film. For example, the capping film 126 may be formed of a double oxide film (two oxide films) or may be formed of a multilayer structure formed by stacking an oxide film and other material films different from the oxide film. In some implementations, the oxide film of the capping film 126 may include an ultra low temperature oxide (ULTO) film such as a silicon oxide film ($SiO_2$).

The grid structure 140b may include an inner grid IG' and an outer grid OG'.

The inner grid IG' may include a barrier metal layer 141a formed over the substrate 110, a metal layer 141b formed over the barrier metal layer 141a, and insulation films 143 and 144 formed to cap the barrier metal layer 141a and the metal layer 141b.

The barrier metal layer 141a may include any one of titanium (Ti) and titanium nitride (TiN), or may include a stacked structure of titanium (Ti) and titanium nitride (TiN). The metal layer 141b may include tungsten (W).

The insulation film 143 may include the nitride film 143, and the other insulation film 144 may include the oxide film 144. The nitride film 143 may be formed at side surfaces of the barrier metal layer 141a and the metal layer 141b and at a top surface of the metal layer 141b. The oxide film 144 may be formed over the nitride film 143. In this case, the nitride film 143 may include a silicon nitride film ($Si_xN_y$, where each of 'x' and 'y' is a natural number) or a silicon oxide nitride film ($Si_xO_yN_z$, where each of 'x', 'y', and 'z' is a natural number). The oxide film 144 may include an undoped silicate glass (USG) film. In addition, the insulation films 143 and 144 may be formed of the same material film, for example, an oxide film such as $SiO_2$.

The outer grid OG' may include an air layer 145, a support film 146 formed over the air layer 145, and a capping film 147 formed to perform capping of the air layer 145 and the support film 146.

In an implementation, the air layer 145 may be formed between side surfaces of the inner grid IG (e.g., side surfaces of the oxide film 144) and the capping film 147 of the outer grid OG. In another implementation, the air layer 145 may be formed at both the side surfaces of the inner grid IG and a top surface of the inner grid IG, thereby capping the entirety of the inner grid IG.

The support film 146 may be used to maintain the shape of the grid structure 140b. For example, the support film 146 may prevent the capping film 147 from collapsing in a process for forming the air layer 145 in the grid structure 140b. The support film 146 may include an insulation film having no light absorption characteristics. The support film 146 may operate as an insulation film that is different in etch selectivity from a spin-on carbon (SOC) film. The support film 146 may include at least one of a silicon oxide nitride film (e.g., $Si_xO_yN_z$, where each of 'x', 'y', and 'z' is a natural number), a silicon oxide film (e.g., $Si_xO_y$, where each of 'x' and 'y' is a natural number), and a silicon nitride film (e.g., $Si_xN_y$, where each of 'x' and 'y' is a natural number).

The capping film 147 may be a material film formed at an outermost part of the grid structure 140 to define a specific region in which the air layer 145 is formed. For example, the capping film 147 is formed to cover the air layer 145 and the support film 146. The capping film 147 may be formed not only at side surfaces of the air layer 145 and the support film 146 but also over a top surface of the support film 146. The capping film 147 may be formed of the same material film as the capping film 126 of the buffer layer. Although the capping film 126 and the capping film 147 are illustrated as distinguished from each other for convenience of description, it should be noted that the capping films 126 and 147 may also be simultaneously formed by the same deposition process.

FIGS. 5A to 5G are cross-sectional views illustrating methods for forming the structure shown in FIG. 4.

Figure 5A:
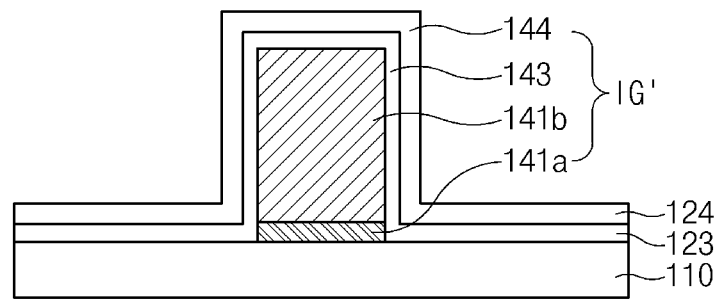
FIGS. 5A to 5G are cross-sectional views illustrating methods for forming the structure shown in FIG. 4.

Referring to FIG. 5A, the barrier metal layer 141a and the metal layer 141b may be sequentially formed over the substrate 110 including one or more photoelectric conversion elements 112.

For example, after the barrier metal material and the metal material have been sequentially deposited over the substrate 110, the barrier metal material and the metal material may be etched using a mask pattern (not shown) formed to define the metal layer region of the inner grid as an etch mask, resulting in formation of a stacked structure of the barrier metal layer 141a and the metal layer 141b. In this case, the barrier metal material may include any one of titanium (Ti) and titanium nitride (TiN), or may include a stacked structure of titanium (Ti) and titanium nitride (TiN). The metal layer may include tungsten (W).

Subsequently, the nitride films 123 and 143 may be formed over the substrate 110, the barrier metal layer 141a, and the metal layer 141b, and the oxide films 124 and 144 may be formed over the nitride films 123 and 143, resulting in formation of the inner grid IG. In this case, the nitride film 123 and the oxide film 124 formed at both sides of the inner grid IG' and over the substrate 110 may constitute a part of the buffer layer 120b.

Although the nitride films 123 and 143 are illustrated as distinguished from each other depending on where they are formed, it should be noted that the nitride films 123 and 143 may also be simultaneously formed by the same deposition process as necessary. In addition, although the oxide films 124 and 144 are illustrated as distinguished from each other depending on where they are formed, it should be noted that the oxide films 124 and 144 may also be simultaneously formed by the same deposition process as necessary. That is, the nitride film 143 and the oxide film 144 may be formed over the barrier metal layer 141a and the metal layer 141b, as part of the inner grid IG'. The nitride film 123 and the oxide film 124 may constitute a part of the buffer layer 120b, and may be formed over the substrate 110 formed at both sides of each inner grid (IG').

Each of the nitride films 123 and 143 may include a silicon nitride film (e.g., $Si_xN_y$, where each of 'x' and 'y' is a natural number) or a silicon oxide nitride film (e.g., $Si_xO_yN_z$, where each of 'x', 'y', and 'z' is a natural number). Each of the oxide films 124 and 144 may include an undoped silicate glass (USG) film.

Subsequently, the nitride films 123 and 143 and the oxide films 124 and 144 may be annealed. The annealing process may be carried out in a nitrogen (N2) gas environment.

Figure 5B:
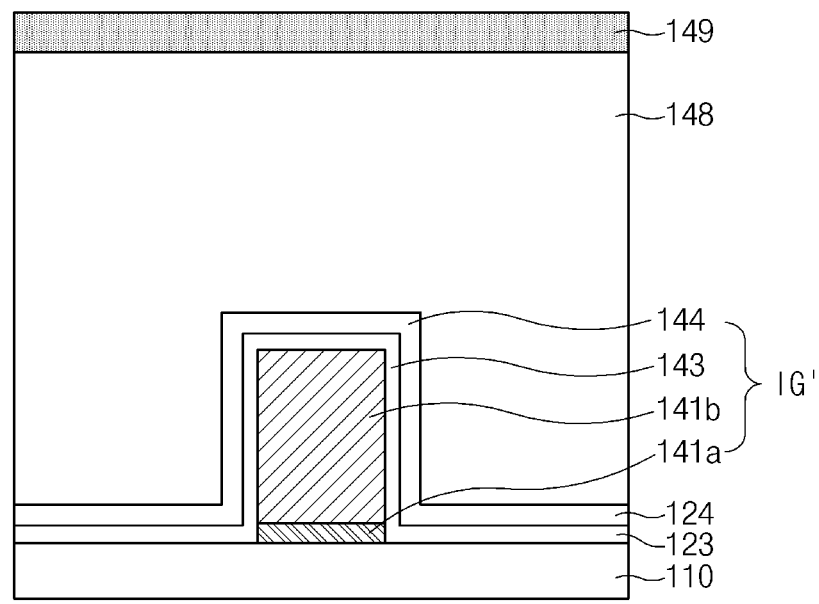

Referring to FIG. 5B, a sacrificial film 148 may be formed over the oxide films 124 and 144, and a support material layer 149 may be formed over the sacrificial film 148.

In this case, the sacrificial film 148 may include a carbon-containing spin-on carbon (SOC) film.

The support material layer 149 may be a material layer to prevent the grid structure from collapsing in a subsequent process. The support material layer 149 may be an insulation film that is different in etch selectivity from the sacrificial film 148, and may include at least one of a silicon oxide nitride film (e.g., $Si_xO_yN_z$, where each of 'x', 'y', and 'z' is a natural number), a silicon oxide film (e.g., $Si_xO_y$, where each of 'x' and 'y' is a natural number), and a silicon nitride film (e.g., $Si_xN_y$, where each of 'x' and 'y' is a natural number).

Figure 5C:
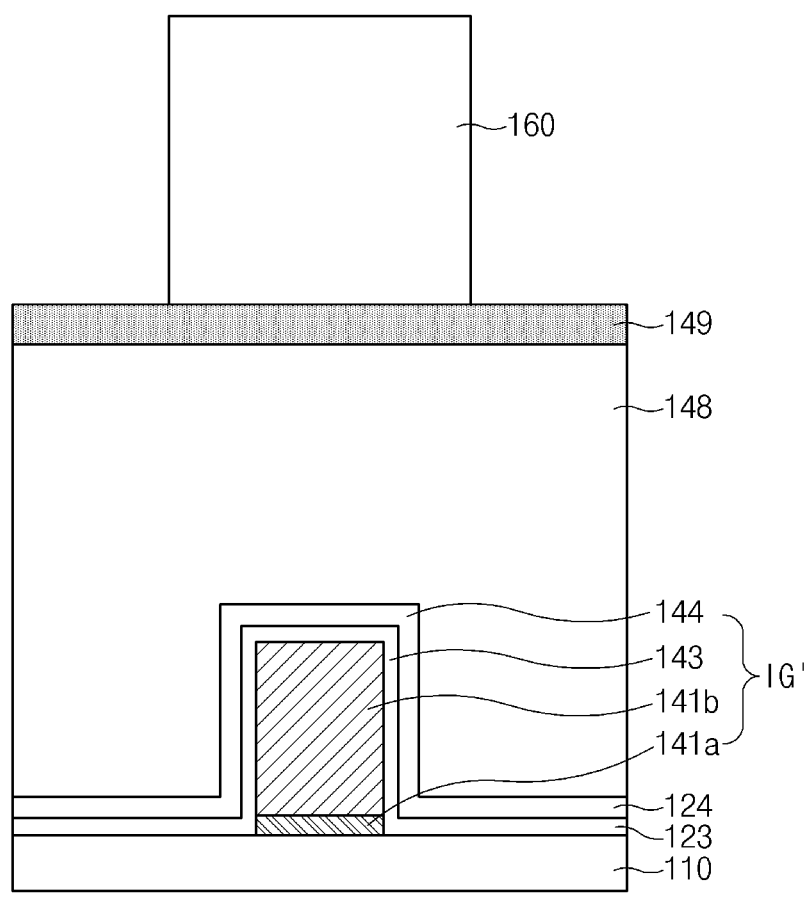

Referring to FIG. 5C, a mask pattern 160 formed to define a region of the air layer 145 of the outer grid OG' may be formed over the support material layer 149.

The mask pattern 160 may include a photoresist pattern.

Figure 5D:
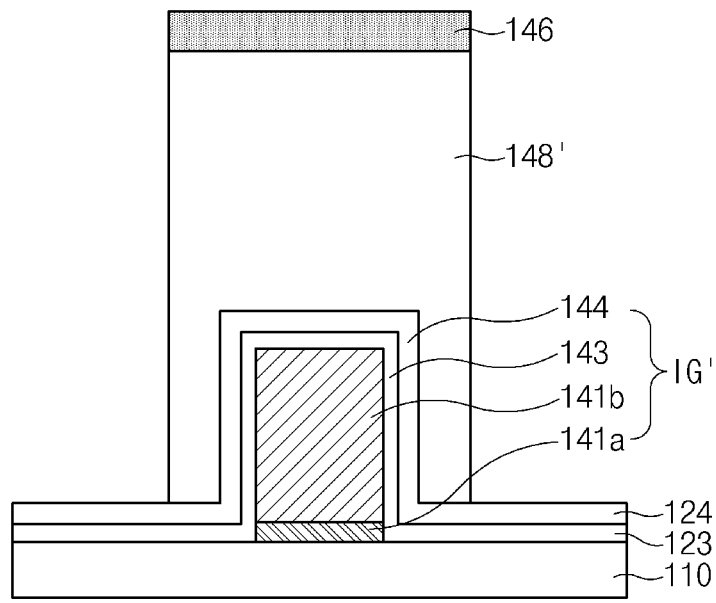

Referring to FIG. 5D, the support material layer 149 and the sacrificial film 148 illustrated in FIG. 5C may be sequentially etched using the mask pattern 160 as an etch mask, such that a stacked structure of the sacrificial film pattern 148' and the support film 146 may be formed over the inner grid IG'.

In this case, the sacrificial film pattern 148' and the support film 146 may be larger in width than the inner grid IG. In other words, the sacrificial film pattern 148' and the support film 146 may be formed to cover the inner grid IG such that the sacrificial film pattern 148' is formed along the top and sides of the inner grid IG.

Figure 5E:
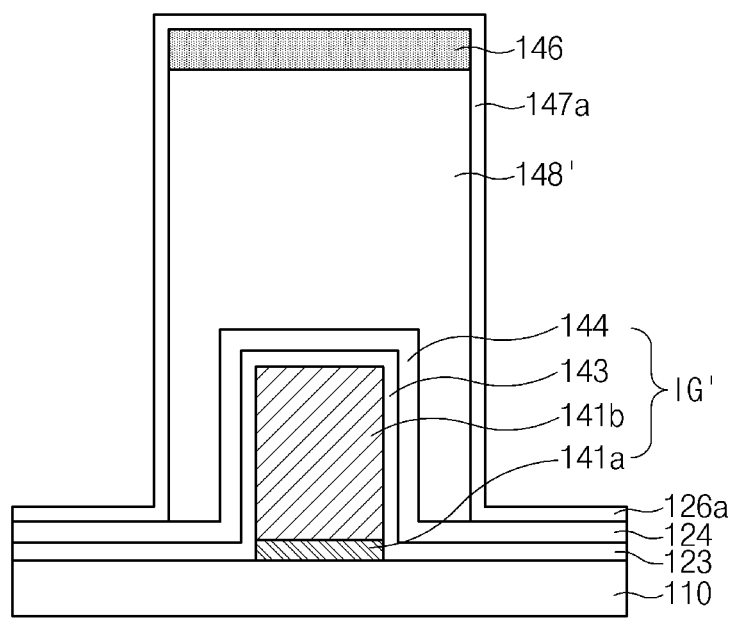

Referring to FIG. 5E, first capping films 147a and 126a may be formed over the oxide film 124, the sacrificial film pattern 148', and the support film 146.

Each of the first capping films 147a and 126a may include an oxide film such as a ULTO film. Specifically, the first capping film 147a may be formed to a predetermined thickness through which molecules formed by a subsequent plasma process can be easily discharged outside the first capping film 147a. For example, plasma processing gases and carbon of the sacrificial film pattern 148' are combined to form molecules inside the first capping film 147a, and the predetermined thickness of the first capping film 147a is thin enough to allow the exchange of materials between inside and outside of the first capping film 147a. In an implementation, the first capping film 147a may be formed to a thickness of 300 Å or less.

Although the first capping films 147a and 126a are illustrated as distinguished from each other depending on where they are formed for convenience of description, it should be noted that the first capping films 147a and 126a may also be simultaneously formed by the same deposition process.

Figure 5F:
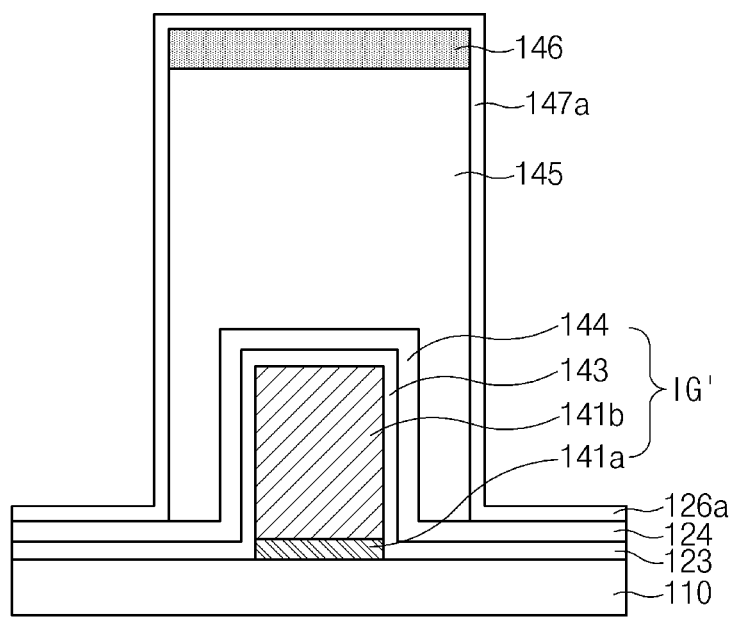

Referring to FIG. 5F, the plasma process may be carried out upon the resultant structure of FIG. 5E, such that the sacrificial film pattern 148' may be removed and the air layer 145 may be formed at the position from which the sacrificial film pattern 148' is removed. In this case, the plasma process may be carried out using gases (e.g., $O_2$, $N_2$, $H_2$, CO, $CO_2$, or $CH_4$) including at least one of oxygen, nitrogen, and hydrogen.

As discussed above, molecules generated by the plasma process can be discharged outside the first capping film 147a. For example, FIG. 6 shows how the exchange of materials occurs between inside and outside of the first capping film 147a to remove the sacrificial film pattern inside the first capping film 147a by the $O_2$ plasma process.

Figure 6:
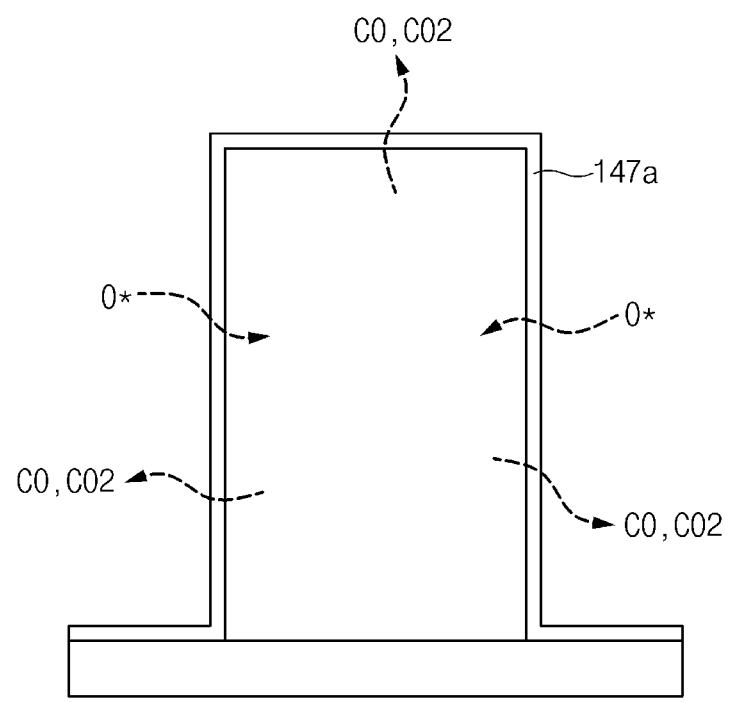
FIG. 6 is a conceptual diagram illustrating a method for removing a sacrificial film pattern through an $O_2$ plasma processing.

As illustrated in FIG. 6, the $O_2$ plasma process is carried out upon the resultant structure of FIG. 5E. Oxygen radicals (O*) may flow into the sacrificial film pattern 148' through the first capping film 147a, and the oxygen radicals (O*) included in the sacrificial film pattern 148' may be combined with carbons of the sacrificial film 148', resulting in formation of CO or $CO_2$. The formed CO or $CO_2$ may be discharged outside through the first capping film 147a. As a result, the sacrificial film pattern 148' may be removed, and the air layer 145 may be formed at the position from which the sacrificial film pattern 148' is removed.

In this case, in order to prevent collapse of the first capping film 147a even in the event that the sacrificial film pattern 148' is removed, the support film 146 may be formed over the sacrificial film pattern 148', and the plasma process may then be carried out thereupon.

In some implementations, in order to more easily remove or etch the sacrificial film pattern 148' during the plasma process, the first capping film 147a is formed thin enough to facilitate the exchange of materials between inside and outside of the first capping film 147a. Therefore, without the support film 146 formed over the sacrificial film pattern 148', the removal or etching of the sacrificial film pattern 148' through the plasma process may make the first capping film 147a vulnerable to collapse. The above-mentioned fact can also be confirmed through experiments.

However, when the support film 146 is first formed over the sacrificial film pattern 148' and the sacrificial film pattern 148' is then removed or etched, the first capping film 147a does not collapse and this has been confirmed through experiments. Therefore, based on some embodiments of the disclosed technology, after the support film 147a is first formed over the sacrificial film pattern 148', the sacrificial film pattern 148' is then removed or etched.

Figure 5G:
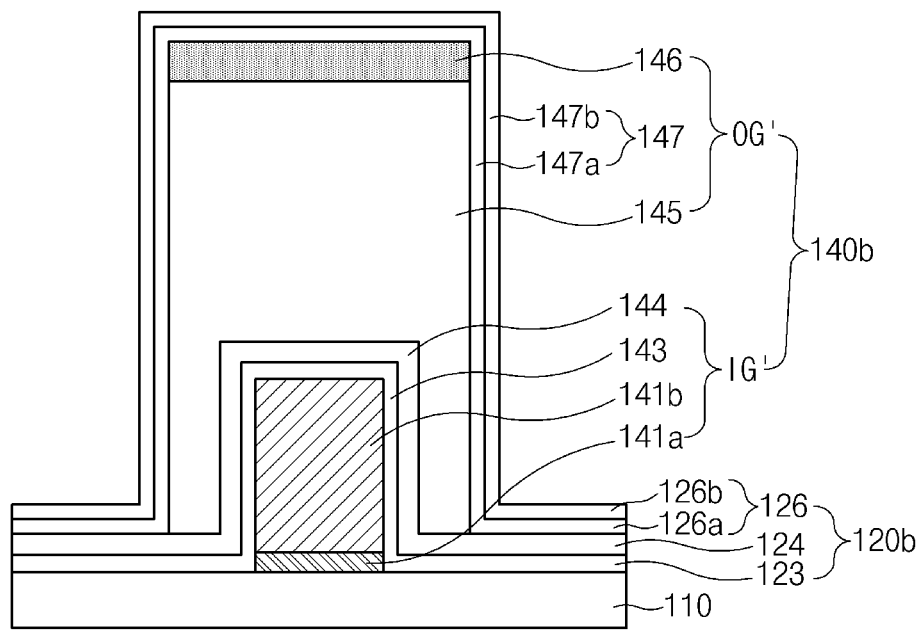

Referring to FIG. 5G, one second capping film 147b may be formed over the first capping film 147a, and the other second capping film 126b may be formed over the first capping film 126a.

When the first capping film 147a is too thick to discharge the sacrificial film pattern 148' through the first capping film 147a during the plasma process. Therefore, in some implementations, the first capping film 147a may be formed as thin as possible.

However, when the capping film 147 is formed of only the first capping film 147a formed as a thin film, the air layer may be collapsed in a subsequent process such as a thermal annealing process. Therefore, the second capping film 147b may be additionally formed over the first capping film 147a after completion of the plasma process. Consequently, the first capping film 147a and the second capping film 147b constitute a capping film 147, which is thick enough to maintain the shape of the grid structure 140b.

The second capping film 126b may be additionally formed over the first capping film 126a disposed between the grid structures 140, resulting in formation of the buffer layer 120b.

In one implementation, the second capping film 147b and the first capping film 147a may be formed of the same materials, and the second capping film 126b and the first capping film 126a may also be formed of the same materials. In another implementation, the second capping film 147b and the first capping film 147a may be formed of different materials, and the second capping film 126b and the first capping film 126a may also be formed of different materials.

Although the second capping films 147b and 126b are illustrated as distinguished from each other depending on where they are formed for convenience of description, it should be noted that the second capping films 147b and 126b may also be simultaneously formed by the same deposition process. In addition, the second capping film 147b and the first capping film 147a may be formed under the same fabrication conditions, and the second capping film 126b and the first capping film 126a may also be formed under the same fabrication conditions.

Thereafter, the color filter layer 130 may be formed to fill a gap between the grid structures 140, and the lens layer 150 may be formed over the color filter layer 130.

Figure 7:
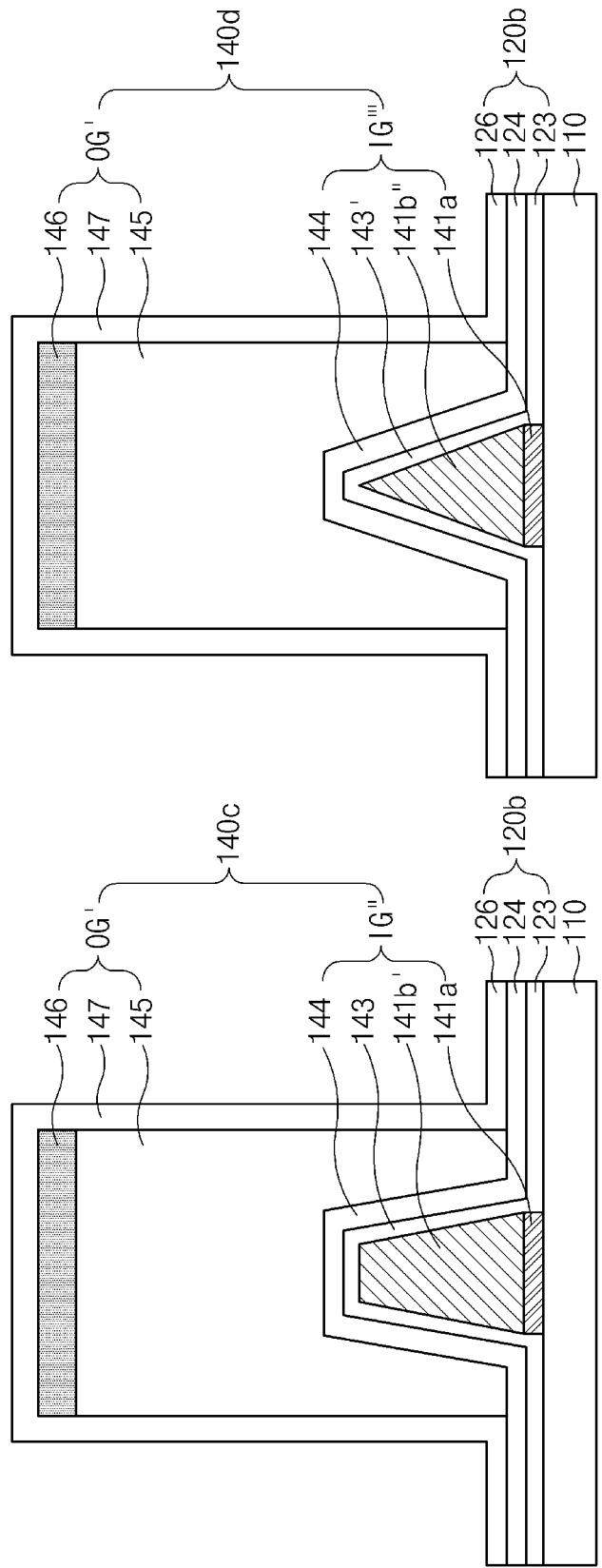
FIG. 7 illustrates cross-sectional views of a structure including a grid structure and a buffer layer based on another embodiment of the disclosed technology.

FIG. 7 illustrates cross-sectional views of a structure including a grid structure and a buffer layer based on still another embodiment of the disclosed technology. In FIG. 7, the same reference numerals as those of FIG. 3 will be used to refer to the same or like parts for convenience of description and better understanding of the disclosed technology.

The inner grids IG" and IG''' shown in FIG. 7 are different in structure from the inner grid IG' shown in FIG. 4.

That is, a cross-section of each of the metal layers 141b' and 141b" based on the embodiment of the disclosed technology is formed in a trapezoidal or triangular shape, so that lateral sides of the metal layers 141b' and 141b" may be formed to be obliquely tilted. In this case, an angle of inclination of a triangle or a trapezoid (i.e., an inner angle between a bottom side and a diagonal line of the triangle, or an inner angle between a bottom side and a side line of the trapezoid) may vary.

Although each of the inner grids shown in FIG. 7 is illustrated as having a triangular shape or a trapezoidal shape for convenience of description, it should be noted that each of the inner grids shown in FIG. 7 may also be formed in a polygonal shape having one or more obliquely tilted lateral sides without departing from the scope of the disclosed technology.

Figure 8:
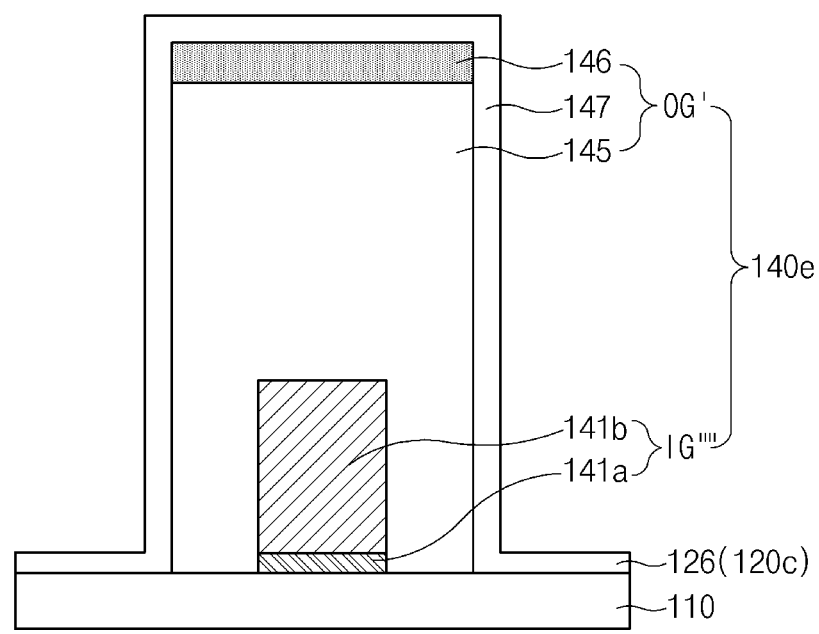
FIG. 8 is a cross-sectional view illustrating a structure including a grid structure and a buffer layer based on another embodiment of the disclosed technology.

FIG. 8 is a cross-sectional view illustrating a structure including a grid structure and a buffer layer based on still another embodiment of the disclosed technology.

In comparison between the inner grid IG"" shown in FIG. 8 and the inner grid IG' shown in FIG. 4, the insulation films 143 and 144 may not be formed over the barrier metal layer 141a and the metal layer 141b as shown in FIG. 8. That is, the nitride film 143 and the oxide film 144 shown in FIG. 4 may not be formed over the barrier metal layer 141a and the metal layer 141b.

In this case, the buffer layer 120c may be formed of the capping film 126 only, and the capping film 126 and the other capping film 147 may be simultaneously formed through the same deposition process.

Figure 9:
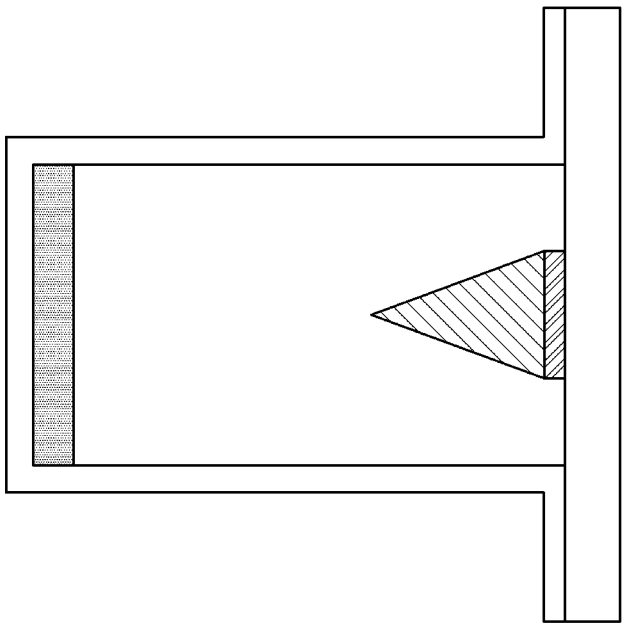
FIG. 9 illustrates cross-sectional views of a structure including a grid structure and a buffer layer based on still another embodiment of the disclosed technology.
Figure 9:
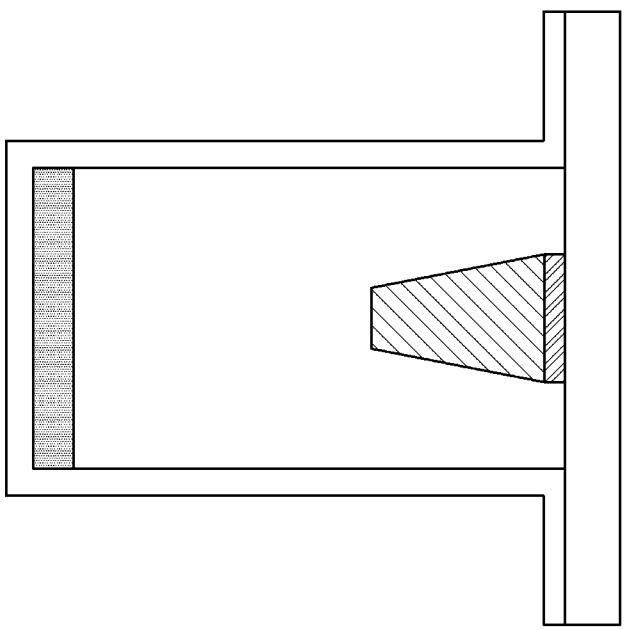

Even when the inner grid is formed of the barrier metal layer and the metal layer as shown in FIG. 8, lateral sides of the metal layer may also be obliquely tilted as shown in FIG. 9.

As is apparent from the above description, the image sensing device based on the embodiments of the disclosed technology can prevent crosstalk while simultaneously maximizing a light guarding effect of incident light.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
a substrate including photoelectric conversion elements;
color filters disposed over the photoelectric conversion elements; and
a grid structure disposed between adjacent color filters over the substrate,
wherein the grid structure includes:
an inner grid layer; and
an outer grid layer that includes an air layer formed outside the inner grid layer, the air layer covering a side surface and a top surface of the inner grid layer.

2. The image sensing device according to claim 1, wherein the outer grid layer includes:
a support film formed over the air layer; and
a capping film formed over the air layer and the support film.

3. The image sensing device according to claim 2, wherein the support film includes at least one of a silicon oxide nitride film and a silicon nitride film.

4. The image sensing device according to claim 2, wherein the capping film includes:
a first capping film formed at side surfaces of the air layer and the support film and at a top surface of the support film; and
a second capping film formed over the first capping film.

5. The image sensing device according to claim 4, wherein the first capping film includes an ultra low temperature oxide (ULTO) film.

6. The image sensing device according to claim 2, wherein the capping film is formed to extend to a region below the color filters and a region along both sides of the grid structure.

7. The image sensing device according to claim 6, wherein the inner grid layer includes:
a barrier metal layer; and
a metal layer formed over the barrier metal layer.

8. The image sensing device according to claim 7, wherein the inner grid layer further includes:
an insulation film formed at side surfaces of the barrier metal layer and the metal layer and at a top surface of the metal layer.

9. The image sensing device according to claim 8, wherein the insulation film is formed to extend to the region below the color filters and is disposed between the substrate and the capping film below the color filters.

10. The image sensing device according to claim 8, wherein the insulation film includes:
a stacked structure of a nitride film and an oxide film.

11. The image sensing device according to claim 7, wherein the metal layer has a cross-section formed in any one of a square shape, a triangular shape, and a trapezoidal shape.

12. The image sensing device according to claim 1, wherein the outer grid layer includes a capping film formed to cover the air layer and extended to a region below the color filters.

13. The image sensing device according to claim 12, wherein the capping film includes:
 a first capping film formed at side surfaces of the air layer and the support film and at a top surface of the support film; and
 a second capping film formed over the first capping film.

14. The image sensing device according to claim 13, wherein the first capping film includes an ultra low temperature oxide (ULTO) film.

15. The image sensing device according to claim 12, wherein the inner grid layer includes:
 a barrier metal layer; and
 a metal layer formed over the barrier metal layer.

16. The image sensing device according to claim 15, wherein the inner grid layer further includes an insulation film formed at side surfaces of the barrier metal layer and the metal layer and at a top surface of the metal layer.

17. The image sensing device according to claim 16, wherein the insulation film is formed to extend to the region below the color filters and is disposed between the substrate and the capping film below the color filters.

18. The image sensing device according to claim 16, wherein the insulation film includes a stacked structure of a nitride film and an oxide film.

19. The image sensing device according to claim 15, wherein the metal layer has a cross-section formed in any one of a square shape, a triangular shape, and a trapezoidal shape.

\* \* \* \* \*